(12) United States Patent
Kimura

(10) Patent No.: US 7,502,569 B2
(45) Date of Patent: Mar. 10, 2009

(54) OPTICAL RECEIVER PREAMPLIFIER

(75) Inventor: Hiroshi Kimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 538 days.

(21) Appl. No.: 10/576,423

(22) PCT Filed: Dec. 1, 2004

(86) PCT No.: PCT/JP2004/017882

§ 371 (c)(1),
(2), (4) Date: Apr. 19, 2006

(87) PCT Pub. No.: WO2005/055416

PCT Pub. Date: Jun. 16, 2005

(65) Prior Publication Data

US 2007/0104493 A1 May 10, 2007

(30) Foreign Application Priority Data

Dec. 3, 2003 (JP) .............................. 2003-404110

(51) Int. Cl.
*H04B 10/06* (2006.01)
(52) U.S. Cl. .................................................. 398/202
(58) Field of Classification Search ......... 398/202–214; 330/208; 250/214 A
See application file for complete search history.

(56) References Cited

U.S. PATENT DOCUMENTS 5,386,109 A   1/1995   Ikeuchi et al.
5,801,588 A * 9/1998   Nishiyama .................. 330/308
6,307,433 B1  10/2001  Ikeda
7,092,644 B2 * 8/2006   Davidson .................... 398/202
7,218,865 B2 * 5/2007   Doh et al. ................... 398/202
7,242,871 B2 * 7/2007   Huang et al. ................ 398/210

FOREIGN PATENT DOCUMENTS

| JP | 03-060208   | 3/1991 |
| JP | 9-232877    | 9/1997 |
| JP | 10-335948   | 12/1998 |
| JP | 2001-217657 | 8/2001 |

OTHER PUBLICATIONS

Nishimura et al., "A 1.25Gbit/s CMOS Burst-Mode Optical Transceiver for Ethernet PON System", 2004 Symposium on VLSI Circuits Digest of Technical Papers, pp. 414-417.
Yamashita et al., "Novel Cell-AGC Technique for Burst-Mode CMOS Preamplifier With Wide Dynamic Range and High Sensitivity for ATM-PON System", IEEE Journal of Solid-State Circuits, vol. 37, No. 7, Jul. 2002, pp. 881-886.

* cited by examiner

*Primary Examiner*—Quan-Zhen Wang
(74) *Attorney, Agent, or Firm*—McDermott Will & Emery LLP

(57) ABSTRACT

An optical receiver preamplifier includes an inverting amplifier 1 and a current-voltage conversion element 2 connected between input and output terminals of the inverting amplifier 1. The inverting amplifier 1 includes a first transistor 3 having a gate connected to the input terminal In of the inverting amplifier 1, a second transistor 4 having a source connected to a drain of the first transistor 3 and a gate to which a predetermined voltage Vb is applied, and a load 5 connected to a drain of the second transistor 4. A third transistor 6 is connected between the input terminal In of the inverting amplifier 1 and a source of the second transistor 4.

14 Claims, 12 Drawing Sheets

OPTICAL RECEIVER PREAMPLIFIER

This application is the U.S. National Phase under 35 U.S.C. § 371 of International Application No. PCT/JP2004/017882, filed Dec. 1, 2004, which in turn claims the benefit of Japanese Application No. 2003-404110, filed Dec. 3, 2003, the disclosures of which Applications are incorporated by reference herein in their entirety.

TECHNICAL FIELD

The present invention relates to an optical receiver preamplifier used in an optical communication system or the like.

BACKGROUND ART

In an optical receiver circuit used in an optical communication system or the like, an optical signal from an optical fiber is converted to a current by a photo diode, and then the current is converted to a voltage signal by the optical receiver preamplifier. If a signal transmission distance through an optical fiber is long, a transmission loss in the fiber becomes large, and a current signal having a very small amplitude is input from the photo diode to the optical receiver preamplifier. In contrast, if a signal transmission distance through an optical fiber is short, a transmission loss in the fiber becomes small. A current signal having a large amplitude is input from the photo diode to the optical receiver preamplifier. Thus, current signals having various different amplitudes ranging from a small amplitude to a large amplitude are input to the optical receiver preamplifier.

Therefore, when a current-voltage conversion gain (transimpedance gain) of the optical receiver preamplifier is increased to detect a small signal, at a time of inputting a large signal, an output voltage is saturated and a waveform is distorted and the signal can not be precisely detected. On the other hand, when the current-voltage conversion gain is reduced to lower saturation of the output voltage, at a time of inputting a small signal, the small signal can not be sufficiently amplified and detection of a small signal is difficult.

To solve the above-described problems, in an optical receiver signal preamplifier disclosed in Patent Reference 1, a diode is connected in parallel to a feedback resistor (RF) connected between input and output terminals of an inverting amplifier. Thus, a voltage drop in the feedback resistor can be cramped, so that saturation of an output voltage can be suppressed. Moreover, an optical receiver preamplifier disclosed in Patent Reference 2, a transistor is connected to the feedback resistor in parallel and an impedance of the transistor is modulated. Thus, a resistance value of a feedback resistor, i.e., a current-voltage conversion gain is varied to prevent saturation of an output voltage.

(Patent Reference 1) Japanese Laid-Open Publication No. H03-060208

(Patent Reference 2) Japanese Laid-Open Publication No. H09-232877

DISCLOSURE OF INVENTION

Problems that the Invention is to Solve

However, in the above-described known technique, a value of the feedback resistor is directly modulated and the operation of the optical receiver preamplifier becomes unstable.

Specifically, if it is assumed that the inverting amplifier employs a one pole system, a transfer function of a transimpedance type preamplifier can be expressed by the following equation:

$$Z_T(S) = -Z_{T0}/(1 + 2\zeta S/\omega_n + S^2/\omega_n^2)$$

In this case, a transfer function of the inverting amplifier is: $A(S) = -A_0/(1+S/\omega_h)$. A low frequency transimpedance gain is expressed by: $Z_{T0} = R_f A_0/(1+A_0)$. A dumping coefficient is expressed by: $\zeta = (1+C_{in}R_f\omega_h)\cdot\omega_n/(2\cdot(1+A_0)\cdot\omega_h)$. A transimpedance band is expressed by: $\omega_n = (\omega_h\cdot(1+A_0)/C_{in}R_f)^{0.5} = (1+C_{in}R_f\omega_h)2C_{in}R_f\zeta$. Note that $C_{in}$ is an entire parasitic capacitance, $R_f$ is a resistance value of a feedback resistor, $A_0$ is a low frequency gain of the inverting amplifier, and $\omega_h$ is an inverting amplifier band.

As described above, in the known optical receiver preamplifier, at a time of inputting an excessive current, a feedback resistor $R_f$ is equivalently reduced due to the operation of a transistor or a diode connected to the feedback resistor $R_f$ in parallel, and the dumping coefficient $\zeta$ is reduced, so that a feedback amount is increased. Accordingly, the transimpedance band $\omega_n$ is increased, but there is no change in the inverting amplifier band $\omega_h$. Therefore, $\omega_n$ approaches $\omega_h$. However, to achieve a stable operation, it is necessary that $\omega_n >> \omega_h$ holds. Thus, when $\omega_n$ approaches $\omega_h$, the operation of the known optical receiver preamplifier becomes unstable and eventually oscillation of an output voltage occurs.

In view of the above-described problems, it is an object of the present invention to provide an optical receiver preamplifier which can realize a stable operation and a wide input dynamic range characteristic, which have been in the trade-off relationship in the known technique, at the same time.

Means of Solving the Problems

To achieve the above-described object, an optical receiver preamplifier according to the present invention includes: an inverting amplifier; and a current-voltage conversion element connected between input and output terminals of the inverting amplifier, the inverting amplifier includes a first transistor having a gate connected to the input terminal of the inverting amplifier, a second transistor having a source connected to a drain of the first transistor and a gate to which a predetermined voltage is applied, and a load connected to a drain of the second transistor, and the optical receiver preamplifier further includes a third transistor connected between the input terminal of the inverting amplifier and the source of the second transistor.

In the optical receiver preamplifier of the present invention, at a time of inputting a large current, a gate voltage of the third transistor is increased to reduce an impedance thereof, so that part of the input current flows in the third transistor and, accordingly, a current flowing in the current-voltage conversion element is reduced. Thus, saturation of an output voltage can be suppressed, so that an input dynamic range can be expanded.

Also, in the optical receiver preamplifier of the present invention, unlike the known configuration, a value of a feedback resistor is not directly modulated by a transistor connected in parallel to the current-voltage conversion element, but by the operation of the third transistor, an excessive input current is bypassed and an open gain of the inverting amplifier is reduced. Thus, the operation of an inventive optical receiver preamplifier does not become unstable.

As described above, with the optical receiver preamplifier of the present invention, operation stability can be maintained and, at the same time, an input dynamic range can be largely expanded. In other words, a stable operation and a wide dynamic range characteristic, which have been in the trade-off relationship in the known technique, can be realized at the same time.

It is preferable that in the optical receiver preamplifier, the predetermined voltage (i.e., a gate voltage) applied to the gate of the second transistor is controlled so that an input terminal voltage of the inverting amplifier and a source voltage of the second transistor agree with each other.

Thus, a stable operation and a wide input dynamic range characteristic can be realized at the same time while fluctuation of an output voltage level is suppressed.

In this case, if the optical receiver preamplifier of the present invention further includes an operational amplifier having an inverting input terminal connected to the source of the second transistor, a non-inverting input terminal connected to the input terminal of the inverting amplifier and an output terminal connected to the gate of the second transistor, the gate voltage of the second transistor can be reliably controlled so that the input terminal voltage of the inverting amplifier and the source voltage of the second transistor agree with each other. That is, a stable operation and a wide input dynamic range characteristic can be realized at the same time while fluctuation of an output voltage level is suppressed. With a simple configuration in which the operational amplifier is added, the above-described effects can be achieved.

Also, in this case, if the optical receiver preamplifier of the present invention further includes: an operational amplifier having an inverting input terminal connected to the source of the second transistor and an output terminal connected to the gate of the second transistor; and a voltage generator circuit for outputting a voltage of the same level as that of the input terminal voltage of the inverting amplifier, the voltage generator circuit having an output terminal connected to the non-inverting input terminal of the operational amplifier, the gate voltage of the second transistor can be reliably controlled so that the input terminal voltage of the inverting amplifier and the source voltage of the second transistor agree with each other. That is, a stable operation and a wide input dynamic range characteristic can be realized at the same time while fluctuation of an output voltage level is suppressed. Moreover, an input terminal of the operational amplifier does not have to be connected to the input terminal of the inverting amplifier. Thus, without increasing a parasitic capacitance in the input terminal of the optical receiver preamplifier, the above-described effects can be achieved.

It is preferable that the optical receiver preamplifier of the present invention further includes: a switch group including a plurality of switches, each being connected to the gate of the third transistor; and a plurality of voltage sources connected to the switches constituting the switch group, respectively, and in the optical receiver preamplifier, in a voltage selected from respective output voltages of the plurality of voltage sources by the switch group is applied to the gate of the third transistor.

Thus, by using the switch group, the gate of the third transistor can be connected to an appropriate voltage source in accordance with an input signal amplitude at high speed, so that a current amount to be bypassed by the third transistor can be varied at high speed. Therefore, even for an input signal of which a signal amplitude rapidly varies, an input dynamic range can be expanded.

It is preferable that in the optical receiver preamplifier, the third transistor is provided plural in number, the optical receiver preamplifier further includes a switch group having a plurality of switches, each being connected to a gate of each of the third transistors, and a plurality of voltage sources connected to the switches constituting the switch group, respectively, and a voltage selected from respective output voltages of the plurality of voltage sources by the switch group is applied to a gate of each of the third transistors.

Thus, by using the switch group, the gate of the third transistor can be connected to appropriate one of the voltage sources according to an input signal amplitude at high speed, so that a current amount to be bypassed by the third transistor can be varied at high speed. Therefore, even for an input signal of which a signal amplitude rapidly varies, an input dynamic range can be expanded.

It is preferable that the optical receiver preamplifier further includes an amplitude detector circuit for outputting a voltage according to an amplitude of a signal input to the input terminal, the amplitude detector circuit having an input terminal connected to the output terminal of the inverting amplifier, and in the optical receiver preamplifier, a voltage output from the amplitude detector circuit is applied to a gate of the third transistor.

Thus, as an amplitude of an output signal of the optical receiver preamplifier is increased, a gate voltage of the third transistor is increased and an impedance thereof is reduced, so that a current amount to be bypassed by the third transistor is increased. Accordingly, saturation of an output voltage of the optical receiver preamplifier is suppressed, so that an input dynamic range can be expanded. Moreover, with a simple configuration in which the amplitude detector circuit is added, the above-described effects can be achieved.

If the optical receiver preamplifier of the present invention includes the switch group (switch group connected between the gate of the third transistor and the plurality of voltage sources), it is preferable that the optical receiver preamplifier further includes a comparator group including at least one comparator having one input terminal to which a voltage output from the inverting amplifier is applied and the other input terminal to which a predetermined voltage is applied, and in the optical receiver preamplifier, based on a comparison result of the comparator group, the switch group is controlled. Thus, when an amplitude of an output signal of the optical receiver preamplifier is increased to exceed a predetermined voltage applied to the comparator, an output of the comparator is inverted, and the switch group can switch a gate voltage of the third transistor to an appropriate voltage value (one of respective output voltages of the plurality of voltage sources) at high speed, based on the output result. Thus, a current amount to be bypassed by the third transistor can be changed at high speed. Accordingly, even for a rapid change in amplitude of an input signal, saturation of an output voltage can be suppressed, so that an input dynamic range can be expanded.

If the optical receiver preamplifier of the present invention includes the switch group (switch group connected between the gate of the third transistor and the plurality of voltage sources), it is preferable that the optical receiver preamplifier further includes: a fourth transistor having a source connected to the input terminal of the inverting amplifier and a gate connected to the output terminal of the inverting amplifier, another current-voltage conversion element connected to a drain of the fourth transistor; and a comparator group including at least one comparator having one input terminal to which a voltage applied to the current-voltage conversion element is applied and the other input terminal to which a predetermined voltage is applied, and in the optical receiver preamplifier, based on a comparison result of the comparator group, the switch group is controlled. Thus, when an input current input to the inverting amplifier, i.e., the optical receiver preamplifier is increased and an output voltage is reduced, the fourth transistor is turned ON and a current in proportion to an excessive input current flows in said another current-voltage conversion element. Due to this, voltage drop in said another current-voltage conversion element is caused, and with the voltage drop, the size of the excessive input current can be monitored in a wide range. Specifically, a voltage applied to said another current-voltage conversion element can be compared with the predetermined voltage using the comparator, and the switch group can switch a gate voltage of the third transistor to an appropriate voltage level (one of respective output voltages of the plurality of voltage sources) at high speed, based on a result of the comparison. Accordingly, even for a rapid change in amplitude of an input signal, saturation of an output voltage can be suppressed, so that an input dynamic range can be expanded.

It is preferable that in the optical receiver preamplifier, each of the first transistor and the second transistor is a bipolar transistor.

Thus, a wider-band optical receiver preamplifier can be realized.

An optical receiver for optical communication according to the present invention is assumed to be an optical receiver for optical communication including the optical receiver preamplifier of the present invention and includes a photo diode for converting an optical signal transmitted through an optical fiber to a current signal, and in the optical receiver, the current signal is converted to a voltage signal by the optical receiver preamplifier.

In the optical receiver for optical communication according to the present invention, the optical receiver preamplifier of the present invention is used. Thus, even for an input signal such as a burst signal of which an amplitude rapidly varies, saturation of an output voltage can be suppressed, so that an input dynamic range can be expanded. That is, an optical receiver for optical communication which allows a stable operation and has a wide input dynamic range characteristic can be realized.

An optical detector according to the present invention is an optical detector including the optical receiver preamplifier of the present invention and includes a photo diode for converting a light signal obtained by condensing light to a current signal, and in the optical detector, the current signal is converted to a voltage signal by the optical receiver preamplifier.

In the optical detector of the present invention, the optical receiver preamplifier of the present invention is used. Thus, even for an input signal such as a burst signal of which an amplitude rapidly varies, saturation of an output voltage can be suppressed, so that an input dynamic range can be expanded. That is, an optical detector which allows a stable operation and has a wide input dynamic range characteristic can be realized.

Effects of the Invention

According to the present invention, by flowing part of an input current in a third transistor, a current flowing in a current-voltage conversion element can be reduced. Thus, saturation of an output voltage can be suppressed, and an input dynamic range can be expanded. Unlike a known structure, a value of a feedback resistor is not directly modulated by a transistor connected in parallel to the current-voltage conversion element, but by the operation of the third transistor, an excessive input current is bypassed and an open gain of the inverting amplifier is reduced. Thus, the operation of an inventive optical receiver preamplifier does not become unstable. Therefore, a stable operation and a wide input dynamic range characteristic, which have been in the trade-off relationship in the known technique, can be realized at the same time.

EXPLANATION OF REFERENCE NUMERALS

Figure 1:
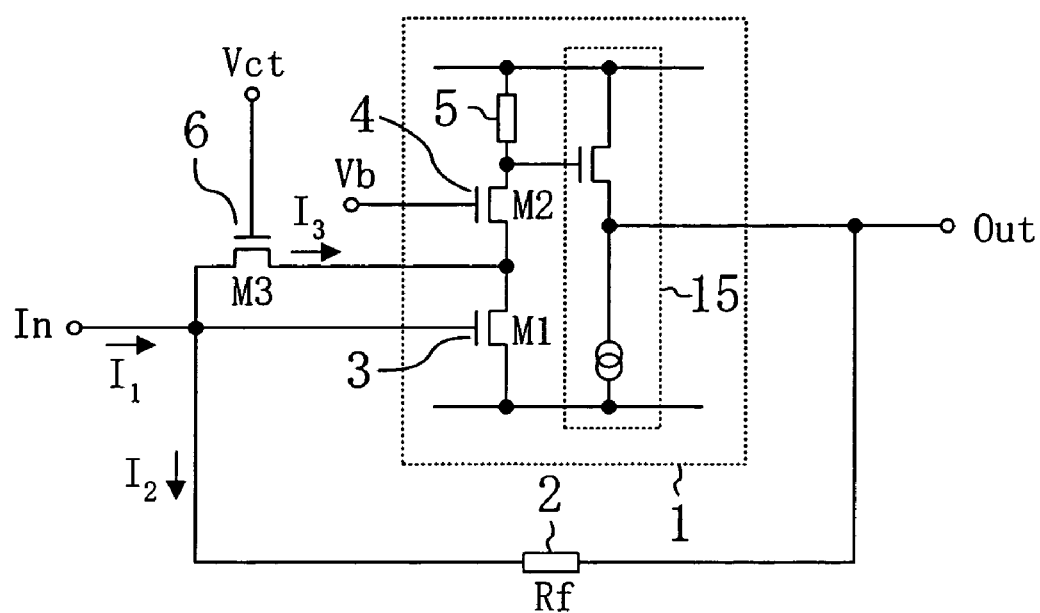
FIG. 1 is a block diagram of an optical receiver preamplifier according to a first embodiment of the present invention.

1 Inverting amplifier
2 Current-voltage conversion element
3 First transistor
4 Second transistor
5 Load
6 Third transistor
7 Operational amplifier
8 Voltage generator circuit
9 Switch group
10 Voltage source
11 Amplitude detector circuit
12 Comparator
13 Fourth transistor
14 Another current-voltage conversion element
15 Source follower
16 Photodiode
17 Optical fiber 18 Lens
19 Light
20 Optical signal

BEST MODE FOR CARRYING OUT THE INVENTION

FIRST EMBODIMENT

Hereinafter, an optical receiver preamplifier according to a first embodiment of the present invention will be described with reference to the accompanying drawings.

FIG. 1 illustrates a schematic configuration of the optical receiver preamplifier of the first embodiment.

As shown in FIG. 1, the optical receiver preamplifier of the present invention is a transimpedance type preamplifier including an inverting amplifier 1 and a current-voltage conversion element (RF) 2 connected between an input terminal In and an output terminal Out of the inverting amplifier 1. In this embodiment, as the current-voltage conversion element 2, for example, a normal resistor is used.

A first feature of this embodiment is that the inverting amplifier 1 includes a first transistor (M1) 3 having a source connected to the ground and a gate connected to the input terminal In of the inverting amplifier 1, a second transistor (M2) 4 having a source connected to a drain of the first transistor 3 and a gate to which a predetermined voltage Vb is applied, and a load 5 connected to a drain of the second transistor 4. In this case, as the load 5, for example, a resistor or a diode-connected transistor (i.e., a transistor having a drain and a gate connected to each other) is used. The first transistor 3, the second transistor 4 and the load 5 together form a cascode amplifier. A voltage of an output node of the cascode amplifier, i.e., a voltage of the drain of the second transistor is applied to the output terminal Out of the inverting amplifier 1 through the source follower 15.

A second feature of this embodiment is that a third transistor 6 which is a current bypass transistor is connected between the input terminal In of the inverting amplifier 1 and the source of the second transistor 4.

In the above-described configuration of this embodiment, at a time of inputting a large current, a gate voltage Vct of the third transistor 6 is increased to reduce an impedance thereof, and part $I_3$ of the input current $I_1$ flows in the third transistor 6. Accordingly, a current flowing in the current-voltage conversion element 2 is reduced to be $I_2=I_1-I_3$. Thus, saturation of an output voltage can be suppressed and expansion of an input dynamic range becomes possible. Moreover, in the configuration of this embodiment, unlike the known configuration, a value of a feedback resistor is not directly modulated by a transistor connected to the current-voltage conversion element 2 in parallel, but an excessive input current is bypassed by the operation of the third transistor 6 and a gain of the cascode amplifier (i.e., an open gain $A_0$ of the inverting amplifier 1) is reduced. Therefore, the operation thereof does not become unstable.

According to the first embodiment, an input dynamic range can be largely expanded while operation stability is maintained. In other words, a stable operation and wide input dynamic range characteristic, which have been in the trade-off relationship in the known technique, can be realized at the same time.

Figure 2:
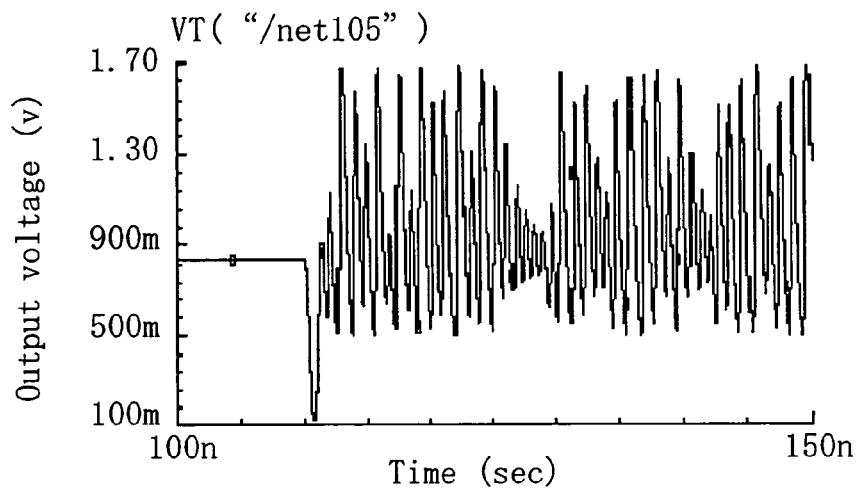
FIG. 2 is a graph showing a simulation result for output voltage when a large current is input to an optical receiver preamplifier having a known configuration.
Figure 3:
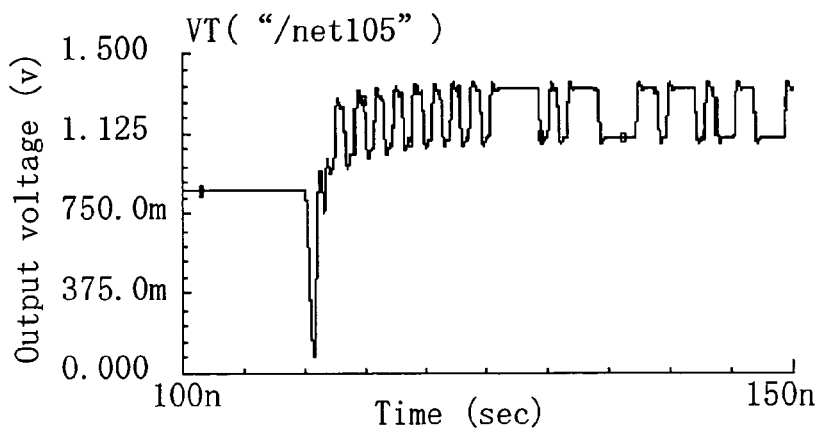
FIG. 3 is a graph showing a simulation result for output voltage when a large current is input to the optical receiver preamplifier of the first embodiment of the present invention.

FIG. 2 illustrates a simulation result for an output voltage when a large current is input to the known optical receiver preamplifier. FIG. 3 illustrates a simulation result for an output voltage when a large current is input to the optical receiver preamplifier of this embodiment. As shown in FIG. 2, in the known configuration, the output voltage is completely oscillated. In contrast, as shown in FIG. 3, a stable output voltage waveform is obtained according to this embodiment.

SECOND EMBODIMENT

Hereinafter, an optical receiver preamplifier according to a second embodiment of the present invention will be described with reference to the accompanying drawings.

Figure 4:
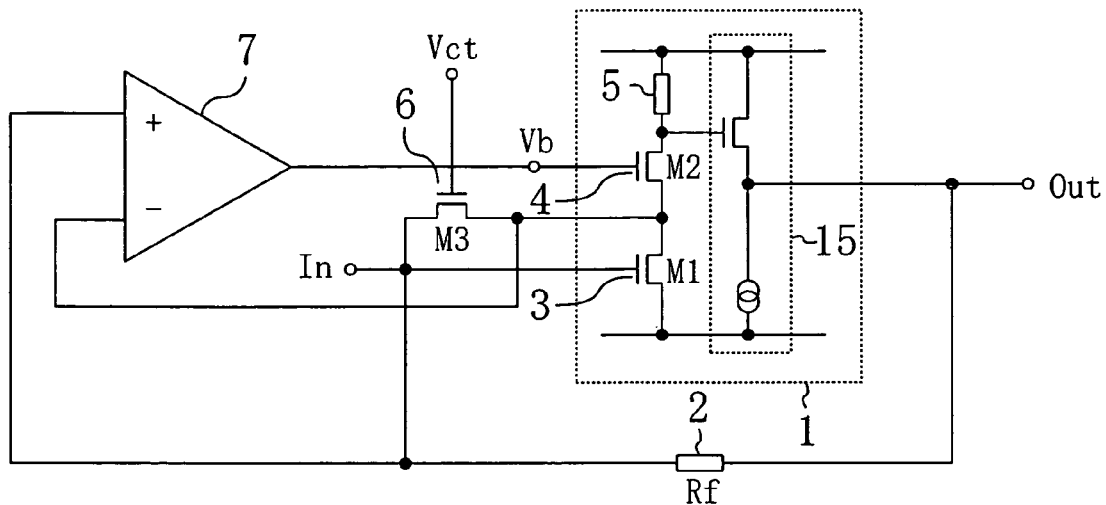
FIG. 4 is a block diagram of an optical receiver preamplifier according to a second embodiment of the present invention.

FIG. 4 illustrates a schematic configuration of the optical receiver preamplifier of the second embodiment. In FIG. 4, each member also shown in FIG. 1 of the first embodiment is identified by the same reference numeral, and therefore the description thereof will be described.

As shown in FIG. 4, the second embodiment is different from the first embodiment in that an operational amplifier 7 is provided. Specifically, the second embodiment has a configuration obtained by adding the operational amplifier 7 to the configuration of the first embodiment. In this case, an inverting input terminal of the operational amplifier 7 is connected to a source of a second transistor 4. Moreover, a non-inverting input terminal of the operational amplifier 7 is connected to an input terminal In of an inverting amplifier 1. Furthermore, an output terminal of the operational amplifier 7 is connected to a gate of the second transistor 4.

With the above-described configuration of this embodiment, a gate voltage (Vb) of the second transistor 4 is controlled so that an input terminal voltage of the inverting amplifier 1 and a source voltage of the second transistor 4 are equal to each other.

According to the first embodiment, it is possible to ensure operation stability and at the same time to expand an input dynamic range with a simple configuration. However, in the first embodiment, when the input terminal voltage of the inverting amplifier 1 and the source voltage of the second transistor 4 are largely different, an amplitude level of an output voltage varies. Specifically, a simulation result for output voltage when a large current is input to the optical receiver preamplifier in a state where the input terminal voltage of the inverting amplifier 1 and the source voltage of the second transistor 4 are largely different is shown in FIG. 3. As shown in FIG. 3, according to the first embodiment, the output voltage level varies.

Figure 5:
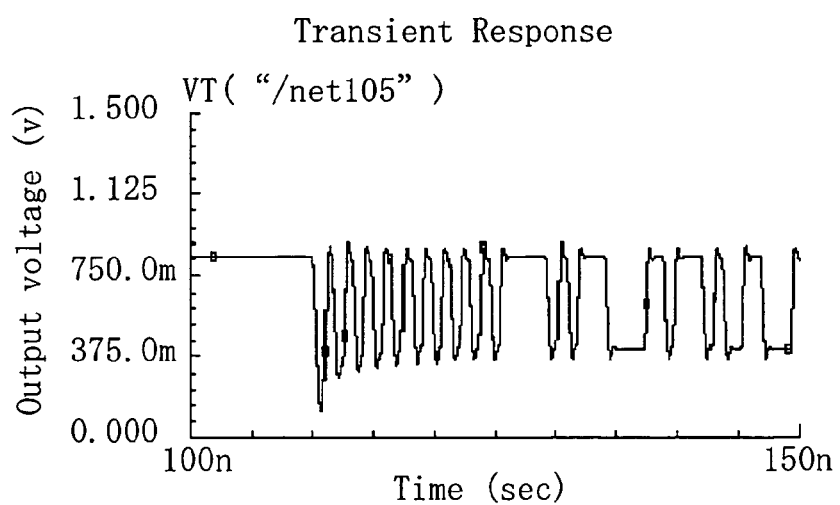
FIG. 5 is a graph showing a simulation result for output voltage when a large current is input to the second embodiment or a third embodiment of the present invention.

FIG. 5 shows a simulation result for an output voltage in the configuration of this embodiment when a gate voltage Vct of a third transistor 6 is increased while the state where the input terminal voltage of the inverting amplifier 1 and the source voltage of the second transistor 4 are equal is maintained. As shown in FIG. 5, according to this embodiment, an output voltage level does not vary and is maintained to be constant.

As described above, according to the second embodiment, in addition to the same effects as those of the first embodiment, the following effects can be achieved. That is, with a simple configuration obtained by adding the operational amplifier 7 to the configuration of the first embodiment, a gate voltage of the second transistor 4 can be controlled so that the input terminal voltage of the inverting amplifier 1 and the source voltage of the second transistor 4 agree with each other. Thus, it is possible to achieve a stable operation and expansion of the input dynamic range at the same time while a constant output voltage level is maintained.

THIRD EMBODIMENT

Hereinafter, an optical receiver preamplifier according to a third embodiment of the present invention will be described with reference to the accompanying drawings.

Figure 6:
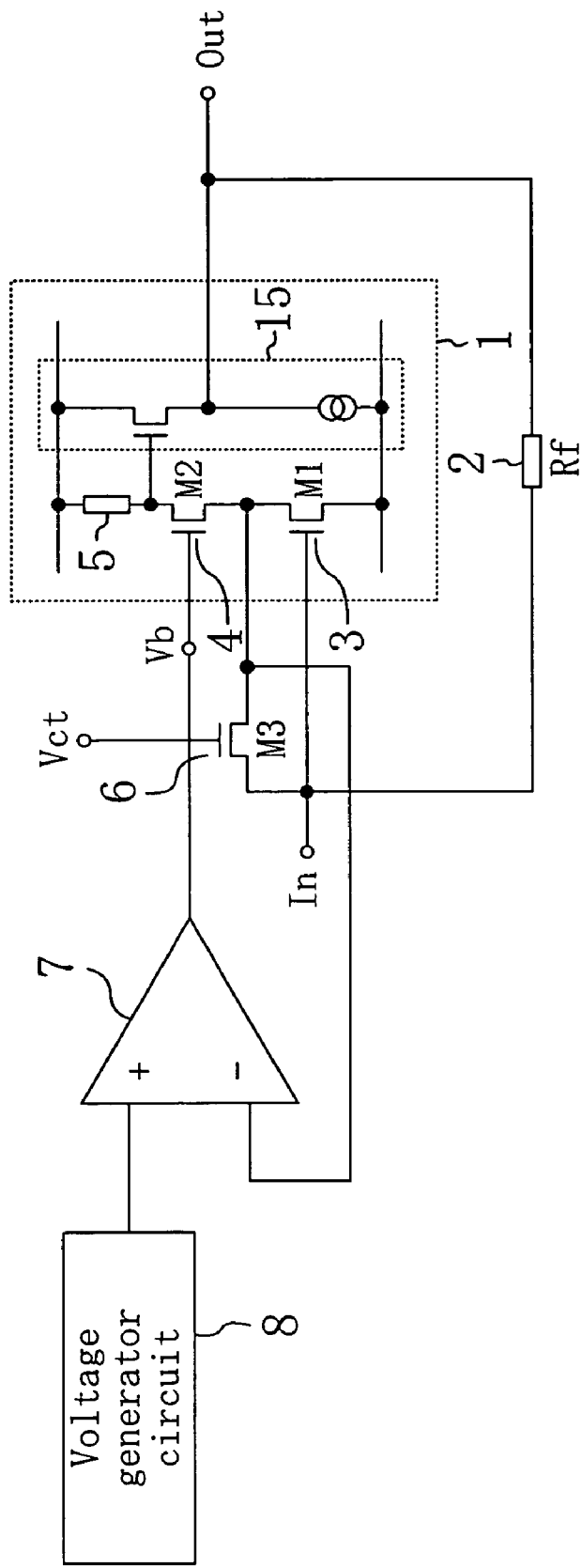
FIG. 6 is a block diagram of an optical receiver preamplifier according to the third embodiment of the present invention.

FIG. 6 illustrates a schematic configuration of the optical receiver preamplifier of the third embodiment. In FIG. 6, each member also shown in FIG. 1 of the first embodiment is identified by the same reference numeral, and the description thereof will be described.

As shown in FIG. 6, the third embodiment is different from the first embodiment in that an operational amplifier 7 and a voltage generator circuit 8 are provided. Specifically, the third embodiment has a configuration obtained by adding the operational amplifier 7 and the voltage generator circuit 8 to the configuration of the first embodiment. In this case, an inverting input terminal of the operational amplifier 7 is connected to the source of a second transistor 4. A non-inverting input terminal of the operational amplifier 7 is connected to an output terminal of the voltage generator circuit 8. Moreover, an output terminal of the operational amplifier 7 is connected to a gate of the second transistor 4. Furthermore, the voltage generator circuit 8 outputs a voltage at the same level as an input terminal voltage of an inverting amplifier 1.

With the above-described configuration of this embodiment, a gate voltage (Vb) of the second transistor 4 is controlled so that the input terminal voltage of the inverting amplifier 1 and the source voltage of the second transistor 4 agree with each other.

According to the second embodiment, the input terminal of the operational amplifier 7 is connected to the input terminal In of the inverting amplifier 1, so that a parasitic capacitance of the input terminal of the transimpedance type preamplifier (i.e., optical receiver preamplifier) is increased. As has been described, a transimpedance band can be expressed by:

$$\omega_n = (\omega_h \cdot (1+A_0)/C_{in} R_f)^{0.5}$$

Increase in parasitic capacitance $C_{in}$ of the input terminal causes reduction in the transimpedance band.

In contrast, according to the third embodiment, an input terminal of the operational amplifier 7 does not have to be connected to the input terminal In of the inverting amplifier 1. Accordingly, the parasitic capacitance of the input terminal of the transimpedance type preamplifier is not increased while the same effects of those of the second embodiment can be achieved.

FOURTH EMBODIMENT

Hereinafter, an optical receiver preamplifier according to a fourth embodiment of the present invention will be described with reference to the accompanying drawings.

Figure 7:
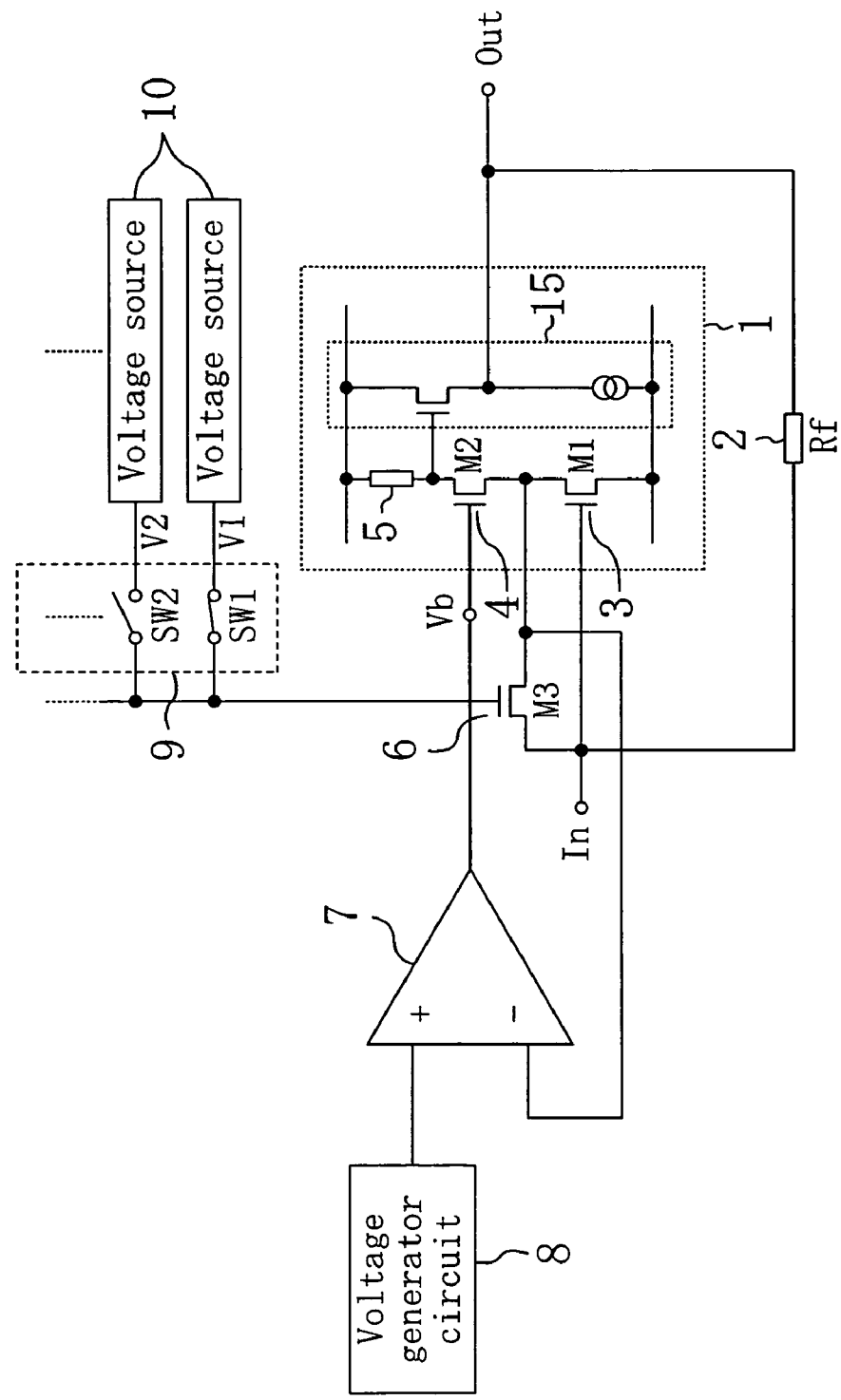
FIG. 7 is a block diagram of an optical receiver preamplifier according to a fourth embodiment of the present invention.

FIG. 7 illustrates a schematic configuration of the optical preamplifier of the fourth embodiment. In FIG. 7, each member also shown in FIG. 6 of the third embodiment is identified by the same reference numeral, and the description thereof will be omitted.

As shown in FIG. 7, the fourth embodiment is different from the third embodiment in that a switch group 9 including a plurality of switches (SW1, SW2, ... ) connected to a gate of a third transistor 6 and a plurality of voltage sources 10 connected to the switches constituting the switch group 9, respectively. That is, the fourth embodiment has a configuration obtained by adding the switch group 9 and the plurality of voltage sources 10 to the configuration of the third embodiment. In this case, the plurality of voltage sources 10 output different voltages V1, V2, ... , respectively. Moreover, a voltage (for example, output voltage V1) selected from output voltages of the plurality of voltage sources 10 by the switch group 9 is applied to a gate of the third transistor 6.

According to the fourth embodiment, in addition to the same effects as those of the third embodiment, the following effects can be achieved. That is, using the switch group 9, the gate of the third transistor 6 can be connected to appropriate one of the voltage sources 10 which corresponds to an input signal amplitude at high speed, and a current amount to be bypassed by the third 6 can be varied at high speed. Thus, saturation of an output voltage can be suppressed according to a rapid change of the input signal amplitude, so that expansion of an input dynamic range can be achieved.

In the fourth embodiment, the switch group 9 and the plurality of voltage sources 10 are added to the configuration of the third embodiment. However, it is needless to say that the switch group 9 and the plurality of voltage sources 10 may be added to the configuration of the first or second embodiment, instead of the configuration of the third embodiment.

In the fourth embodiment, the configuration in which the voltage sources 10 are connected to the switches of the switch group 9 in a one-to-one correspondence. However, a connection relationship between the switch group 9 and the voltage source 10 is not specifically limited.

FIFTH EMBODIMENT

Hereinafter, an optical receiver preamplifier according to a fifth embodiment of the present invention will be described with reference to the accompanying drawings.

Figure 8:
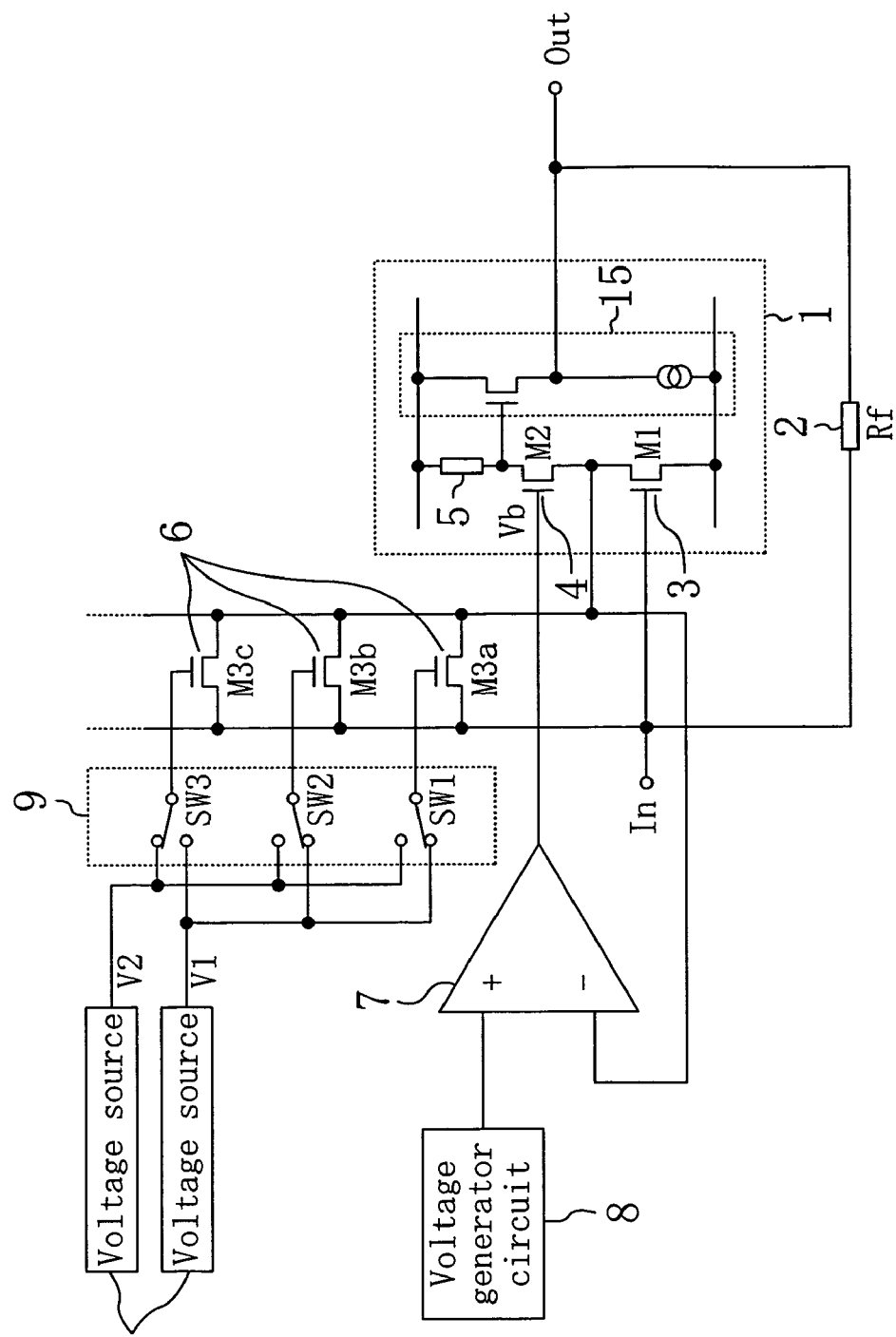
FIG. 8 is a block diagram of an optical receiver preamplifier according to a fifth embodiment of the present invention.

FIG. 8 illustrates a schematic configuration of the optical receiver preamplifier of the fifth embodiment. In FIG. 8, each member also shown in FIG. 6 of the third embodiment is identified by the same reference numeral, and therefore the description thereof will be omitted.

As shown in FIG. 8, the fifth embodiment is different from the third embodiment in that a plurality of transistors (M3a, M3b, M3c, ... ) are provided so that each of the transistors serves as a third transistor 6, a switch group 9 including a plurality of switches (SW1, SW2, SW3, ... ) connected to a gate of each of the third transistors 6 and a plurality of voltage sources (two voltage sources in this embodiment) 10 connected to the switches constituting the switch group 9 are provided. In this case, the two voltage sources 10 outputs different voltages V1 and V2, respectively. One of the output voltages V1 and V2 of the two voltage sources 10 selected by the switch group 9 is applied to the gate of each of the third transistors 6.

According to the fifth embodiment, in addition to the same effects as those of the third embodiment, the following effects can be achieved. That is, using the switch group 9, the gate voltage of each of the third transistors 6 can be switched to the output voltages V1 or V2 of the two voltage sources 10 at high speed. Accordingly, an impedance between an input terminal In of an inverting amplifier 1 and a source of the second transistor 4 can be switched at high speed. Thus, a current amount to be bypassed by the third transistors 6 can be changed at high speed, so that for an input signal such as a burst signal of which an amplitude rapidly varies, an input dynamic range can be expanded.

In the fifth embodiment, based on the configuration of the third embodiment, the plurality of the third transistors 6, the switch group 9 and the plurality of voltage sources 10 are used. It is needless to say that, based on the configuration of the first or second embodiment, instead of the configuration of the third embodiment, the plurality of third transistors 6, the switch group 9, and the plurality of the voltage sources 10 may be used.

It is also needless to say that, in the fifth embodiment, the number of the plurality of voltage sources 10 is not limited. In this embodiment, the configuration in which the switches of the switch group 9 are connected to the third transistors 6, respectively, and the plurality of voltage sources 10 are connected to each of the switches is used. However, the connection relationship between the third transistors 6 and the switch group 9 and the connection relationship between the switch group 9 and the voltage sources 10 are not specifically limited.

SIXTH EMBODIMENT

Hereinafter, an optical receiver preamplifier according to a sixth embodiment of the present invention will be described with reference to the accompanying drawings.

Figure 9:
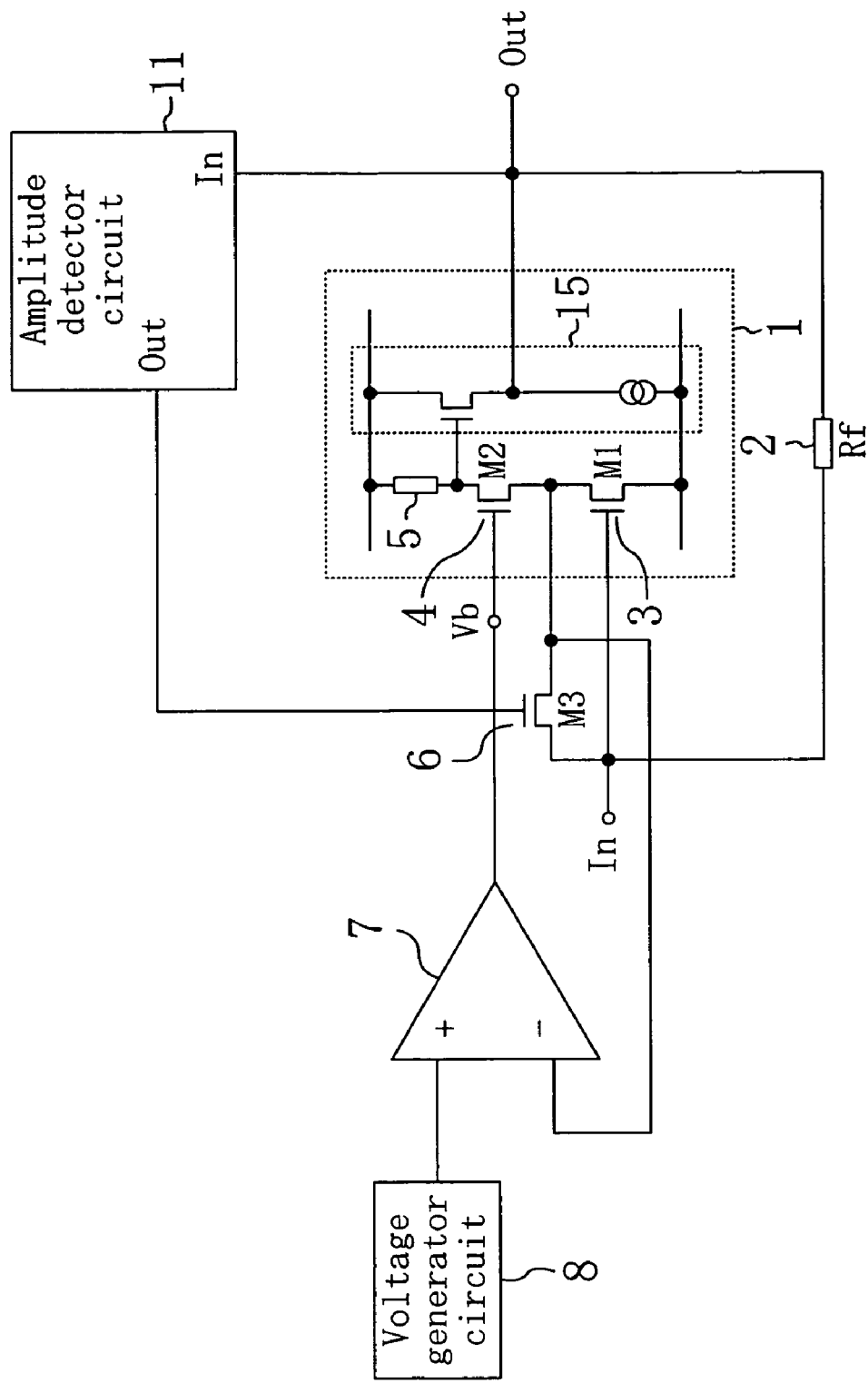
FIG. 9 is a block diagram of an optical receiver preamplifier according to a sixth embodiment of the present invention.

FIG. 9 illustrates a schematic configuration of the optical receiver preamplifier of the sixth embodiment. In FIG. 9, each member also shown in FIG. 6 of the third embodiment is identified by the same reference numeral, and therefore the description thereof will be omitted.

As shown in FIG. 9, the sixth embodiment is different from the third embodiment in that an amplitude detector circuit 11 is provided. That is, the sixth embodiment has a configuration obtained by adding the amplitude detector circuit 11 to the configuration of the third embodiment. In this case, the amplitude detector circuit 11 outputs a voltage in proportion to an amplitude of an input signal (in this embodiment, it is assumed that in the amplitude detector circuit 11, an output voltage is increased as the amplitude of the input signal is increased). The input terminal of the amplitude circuit 11 is connected to an output terminal Out of an inverting amplifier 1 and an output terminal of the amplitude detector circuit 11 is connected to a gate of the third transistor 6. That is, a voltage output from the amplitude detector circuit 11 is applied to the gate of the third transistor 6.

According to the sixth embodiment, in addition to the same effects as those of the third embodiment, the following effects can be achieved. Specifically, as an amplitude of an output signal of the inverting amplifier 1, i.e., an output signal of the optical receiver preamplifier is increased, a voltage of the gate of the third transistor 6 is increased by the amplitude detector circuit 11 and an impedance thereof is reduced, so that a current amount (the size of a current $I_3$ in FIG. 1) to be bypassed by the third transistor 6 is increased. Accordingly, a current (current $I_2$ in FIG. 1) flowing in the current-voltage conversion element 2 is reduced and saturation of an output voltage of the optical receiver preamplifier is suppressed, so that the input dynamic range can be expanded. Also, with a simple configuration in which the amplitude detector circuit 11 is added, the above-described effects can be achieved.

SEVENTH EMBODIMENT

Hereinafter, an optical receiver preamplifier according to a seventh embodiment of the present invention will be described with reference to the accompanying drawings.

Figure 10:
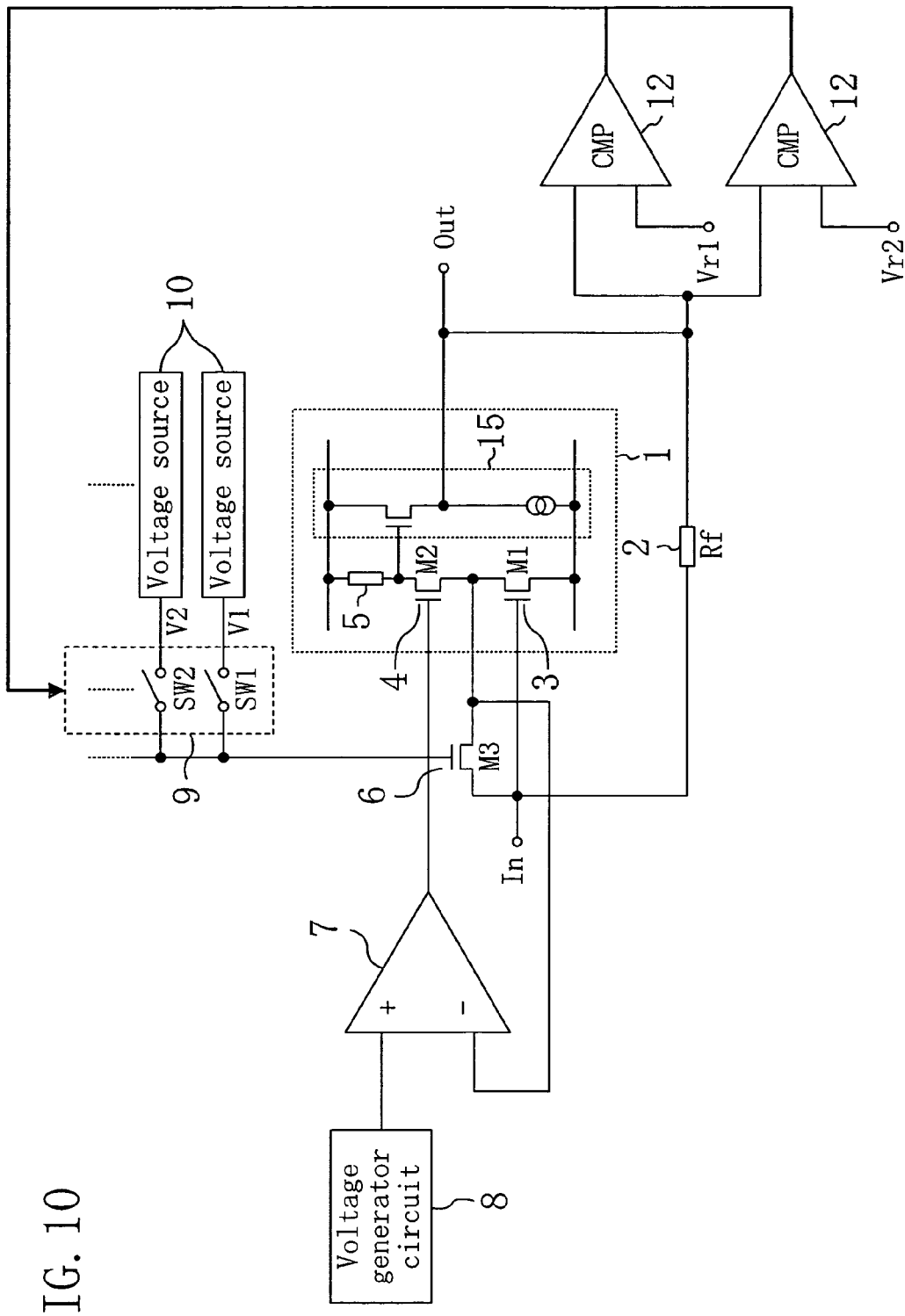
FIG. 10 is a block diagram of an optical receiver preamplifier according to a seventh embodiment of the present invention.

FIG. 10 illustrates a schematic configuration of the optical receiver preamplifier of the seventh embodiment. In FIG. 10, each member also shown in FIG. 7 of the fourth embodiment is identified by the same reference numeral, and therefore the description thereof will be omitted.

As shown in FIG. 10, the seventh embodiment has a configuration obtained by adding, for example, a comparator group including two comparators 12 to the configuration of the fourth embodiment. Specifically, one input terminal of each of the comparators 12 is connected to an output terminal Out of an inverting amplifier 1. That is, a voltage output from the inverting amplifier 1 is applied to one input terminal of each of the comparators 12. A predetermined voltage is applied to the other input terminal of each of the comparators 12 (i.e., different voltages, e.g., Vr1 and Vr2 are applied to the other input terminals of the comparators 12, respectively). The operation of a switch group 9 is controlled, based on a comparison result of each of the comparators 12.

According to the seventh embodiment, in addition to the same effects as those of the fourth embodiment, the following effects can be achieved. That is, when the amplitude of the output signal of the inverting amplifier 1, i.e., the output signal of the optical receiver preamplifier is increased to exceed a predetermined voltage (Vr1 or Vr2) applied to one of the comparators 12, an output of the comparator 12 is inverted, so that the switch group 9 can switch a gate voltage of the third transistor 6 to an appropriate voltage value (i.e., one of output voltages of a plurality of voltage sources 10) at high speed, based on the output result. Thus, a current amount to be bypassed by the third transistor 6 can be changed at high speed. Accordingly, even for a rapid change in amplitude of an input signal, saturation of an output voltage can be suppressed, so that an input dynamic range can be expanded.

In the seventh embodiment, the comparators 12 are added to the configuration of the fourth embodiment. It is needless to say that the comparators 12 may be added to the configuration of the fifth embodiment, instead of the configuration of the fourth embodiment.

In the seventh embodiment, it is also needless to say that the number of the comparators 12 is not limited.

EIGHTH EMBODIMENT

Hereinafter, an optical receiver preamplifier according to an eighth embodiment of the present invention will be described with reference to the accompanying drawings.

Figure 11:
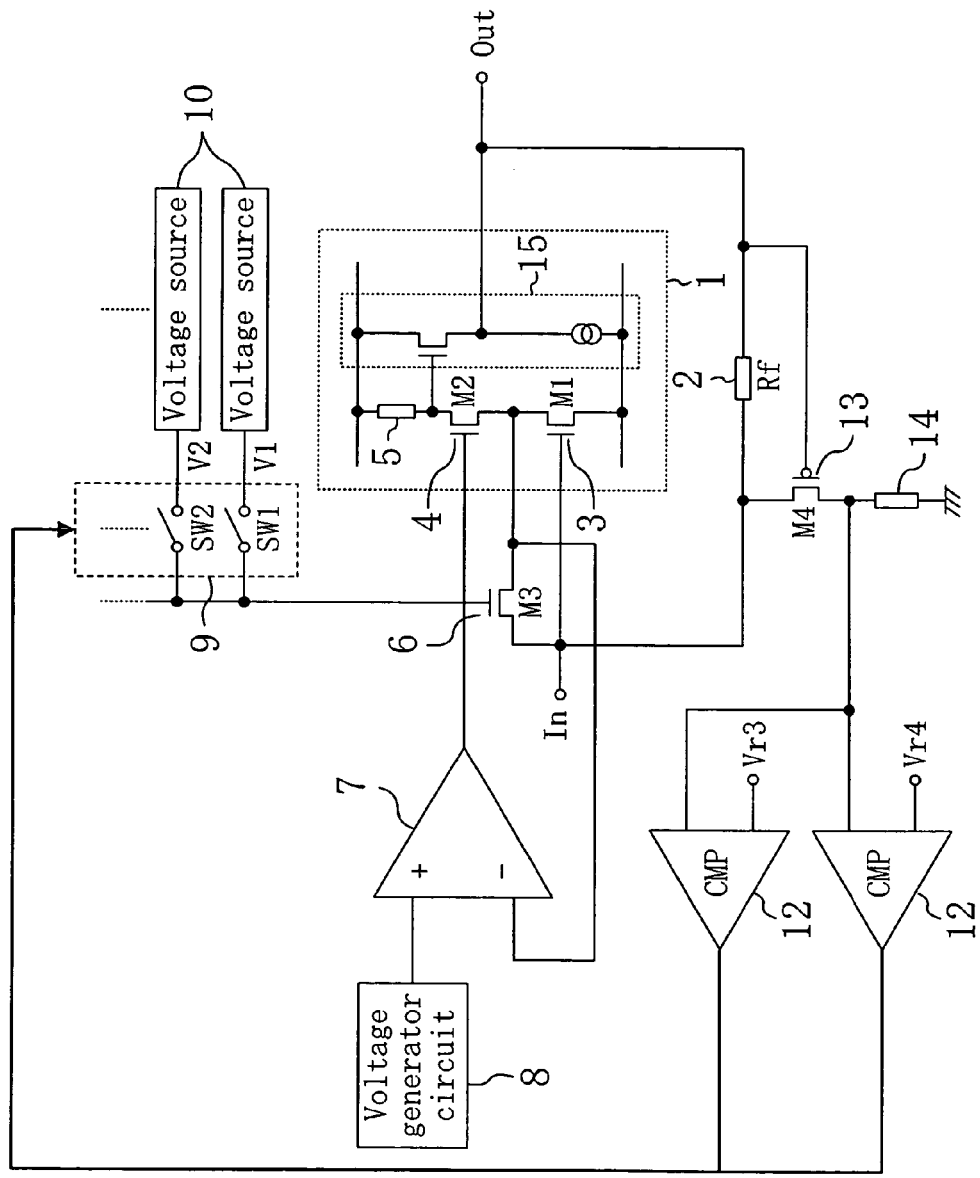
FIG. 11 is a block diagram of an optical receiver preamplifier according to an eighth embodiment of the present invention.

FIG. 11 illustrates a schematic configuration of the optical receiver preamplifier of the eighth embodiment. In FIG. 11, each member also shown in FIG. 7 of the fourth embodiment is identified by the same reference numeral, and therefore the description thereof will be omitted.

As shown in FIG. 11, the eighth embodiment has a configuration obtained by adding a comparator group including, for example, two comparators 12, a fourth transistor (M4) 13, and another current-voltage conversion element 14 to the configuration of the fourth embodiment. In this case, for said another current-voltage conversion element 14, for example, a resistor is used. Specifically, a source of the fourth transistor 13 is connected to an input terminal of the inverting amplifier 1, a gate of the fourth transistor 13 is connected to an output terminal of the inverting amplifier 1, and the drain of the fourth transistor 13 is connected to one terminal of said another current-voltage conversion element 14. The other terminal of said another current-voltage conversion element 14 is connected to the ground. A voltage applied to said another current-voltage conversion element 14 is applied to one input terminal of each of the comparators 12 and a predetermined voltage is applied to the other input terminal of each of the comparators 12 (i.e., different voltages, e.g., Vr3 and Vr4 are applied to the other input terminals of the comparators 12, respectively). Furthermore, the operation of the switch group 9 is controlled, based on a comparison result of each of the comparators 12.

According to the eighth embodiment, in addition to the same effects as those of the fourth embodiment, the following effects will be achieved. That is, when an input current to the inverting amplifier 1, i.e., the optical receiver amplifier is increased and an output voltage is dropped, the fourth transistor 13 is turned ON and a current in proportion to an excessive input current flows in said another current-voltage conversion element 14. Due to this, voltage drop in said another current-voltage conversion element 14 is caused, and with the voltage drop, the size of the excessive input current can be monitored in a wide range. Accordingly, a voltage applied to said another current-voltage conversion element 14 can be compared with the predetermined voltage (Vr3 or Vr4) using the comparators 12 and the switch group 9 can switch a gate voltage to an appropriate voltage level (one of output voltages of a plurality of voltage sources 10) at high speed, based on a result of the comparison. Thus, a current amount to be bypassed by the third transistor 6 can be changed at high speed, so that saturation of an output voltage even with respect to a rapid change of an amplitude of an input signal. Therefore, an input dynamic range can be expanded.

In the eighth embodiment, the comparators 12, the fourth transistor 13 and said another current-voltage conversion element 14 are added to the configuration of the fourth embodiment. However, it is needless to say that the comparators 12, the fourth transistor 13 and said another current-voltage conversion element 14 may be added to the configuration of the fifth embodiment, instead of the configuration of the fourth embodiment.

It is also needless to say that in the eighth embodiment, the number of the comparators 12 is not limited.

Figure 12:
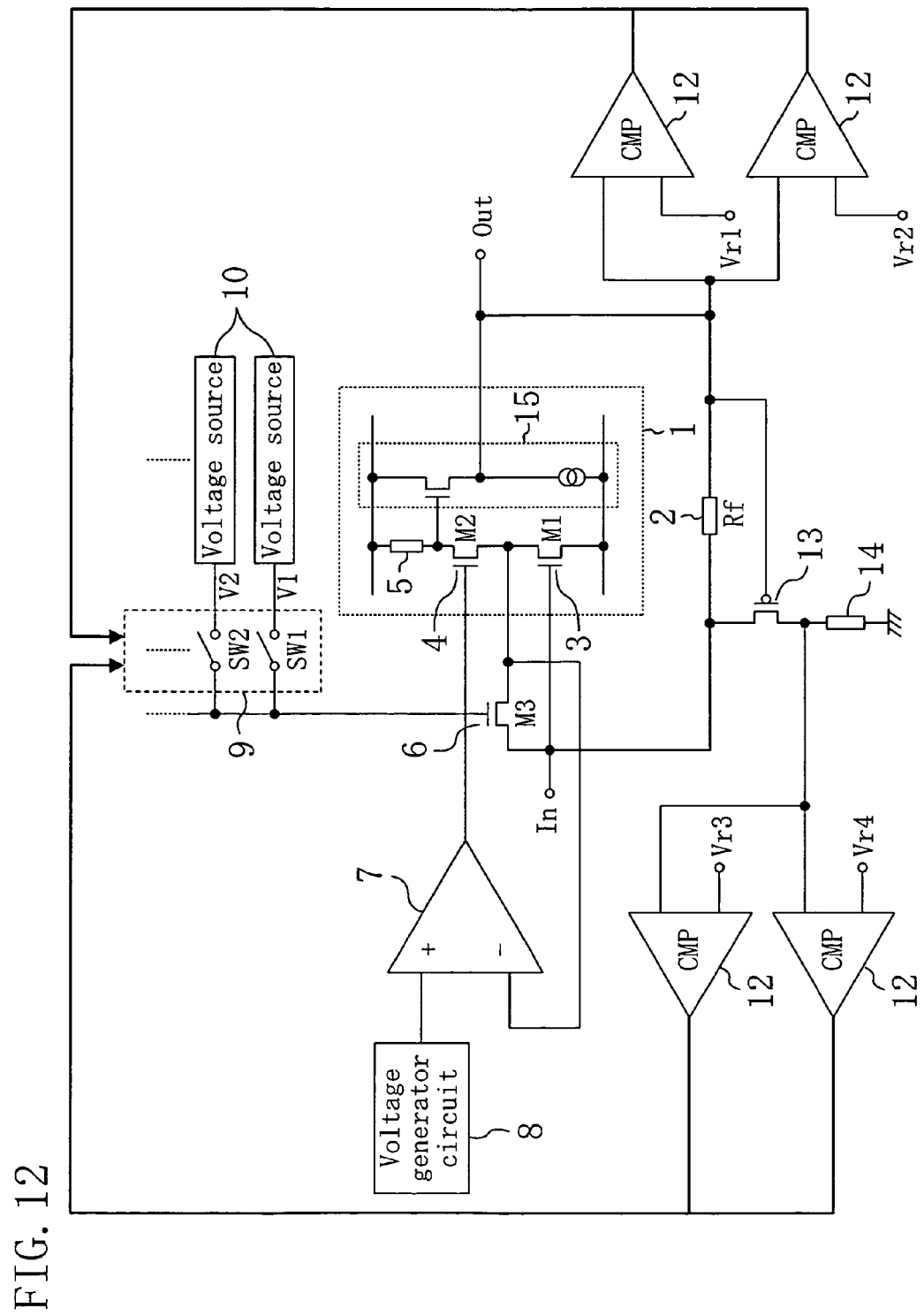
FIG. 12 is a block diagram of a combination of the configuration of the optical receiver preamplifier of the seventh embodiment of the present invention and the configuration of the optical receiver preamplifier of the eighth embodiment of the present invention.

It is also needless to say that a configuration (see FIG. 12) obtained by combination of the configuration of the eighth embodiment shown in FIG. 11 and the configuration of the seventh embodiment shown in FIG. 10 may be used.

Moreover, in each of the first through eighth embodiments, for the first transistor 3 and the second transistor 4, a bipolar transistor may be used. In such a case, in each of the first through eighth embodiments, a gate, a source, a drain are replaced with a base, an emitter and a collector, respectively. Thus, a wider-band optical receiver preamplifier can be realized.

NINTH EMBODIMENT

Hereinafter, an optical receiver for optical communication according to a ninth embodiment of the present invention, specifically, an optical receiver for optical communication using the optical receiver preamplifier of the first embodiment will be described with reference to the accompanying drawings.

Figure 13:
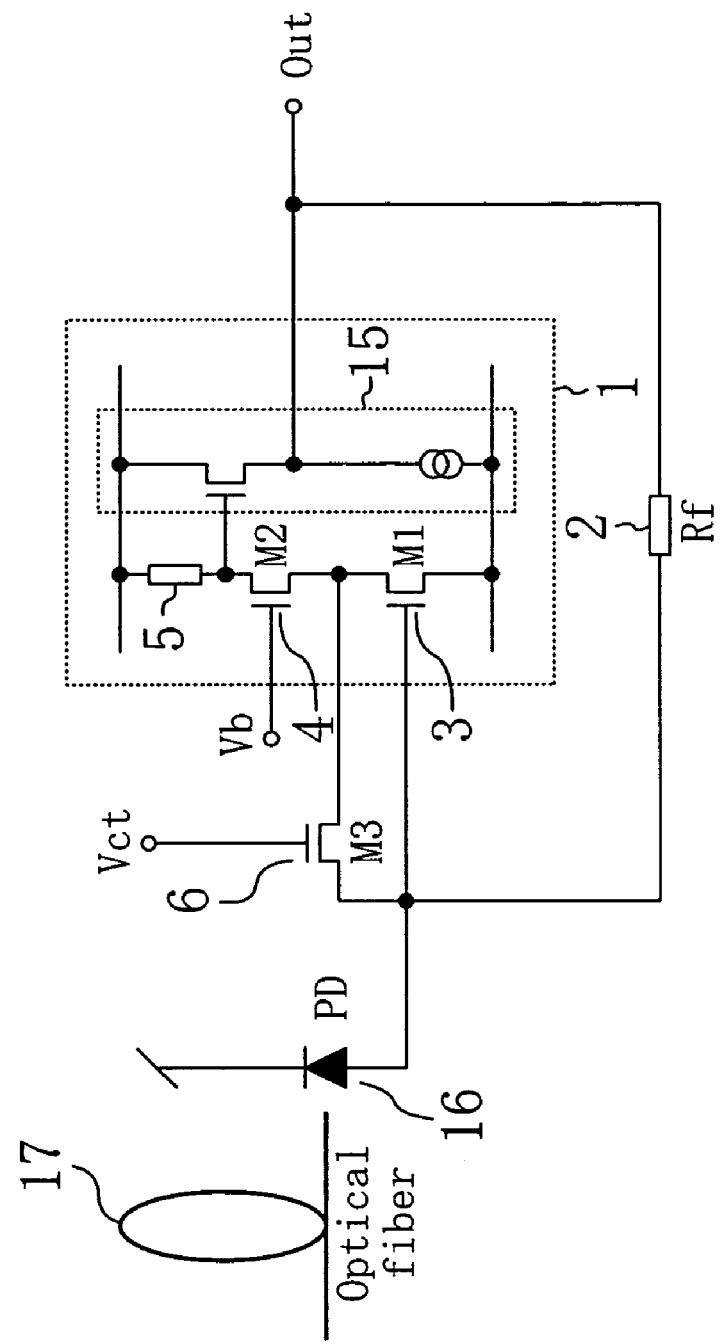
FIG. 13 is a block diagram of an optical receiver preamplifier according to a ninth embodiment of the present invention.

FIG. 13 illustrates a schematic configuration of the optical receiver for optical communication according to the ninth embodiment. In FIG. 13, each member also shown in FIG. 1 of the first embodiment is identified by the same reference numeral, and therefore the description thereof will be omitted.

As shown in FIG. 13, the optical receiver for optical communication according to this embodiment includes, in addition to the optical receiver preamplifier of the first embodiment, a photo diode 16 for converting an optical signal transmitted through an optical fiber 17 to a current signal. Specifically, the photo diode 16 is connected to the input terminal of the optical receiver preamplifier of the first embodiment shown in FIG. 1 and the photo diode 16 and the optical fiber 17 are coupled to each other.

According to the ninth embodiment, a current signal from the photo diode 16 is converted to a voltage signal and amplified by the optical receiver preamplifier of the first embodiment. Accordingly, even for an input signal, such as a burst signal, of which a signal amplitude rapidly varies, saturation of an output voltage can be suppressed, so that an input dynamic range can be expanded. That is, an optical receiver for optical communication which allows a stable operation and has a wide input dynamic range characteristic can be realized.

In the ninth embodiment, the optical receiver preamplifier of the first embodiment is used. However, instead of the optical receiver preamplifier of the first embodiment, the optical receiver preamplifier of any one of the second through eighth embodiments may be used.

TENTH EMBODIMENT

Hereinafter, an optical detector according to a tenth embodiment of the present invention, specifically, an optical detector using the optical receiver preamplifier of the first embodiment will be described with reference to the accompanying drawings.

Figure 14:
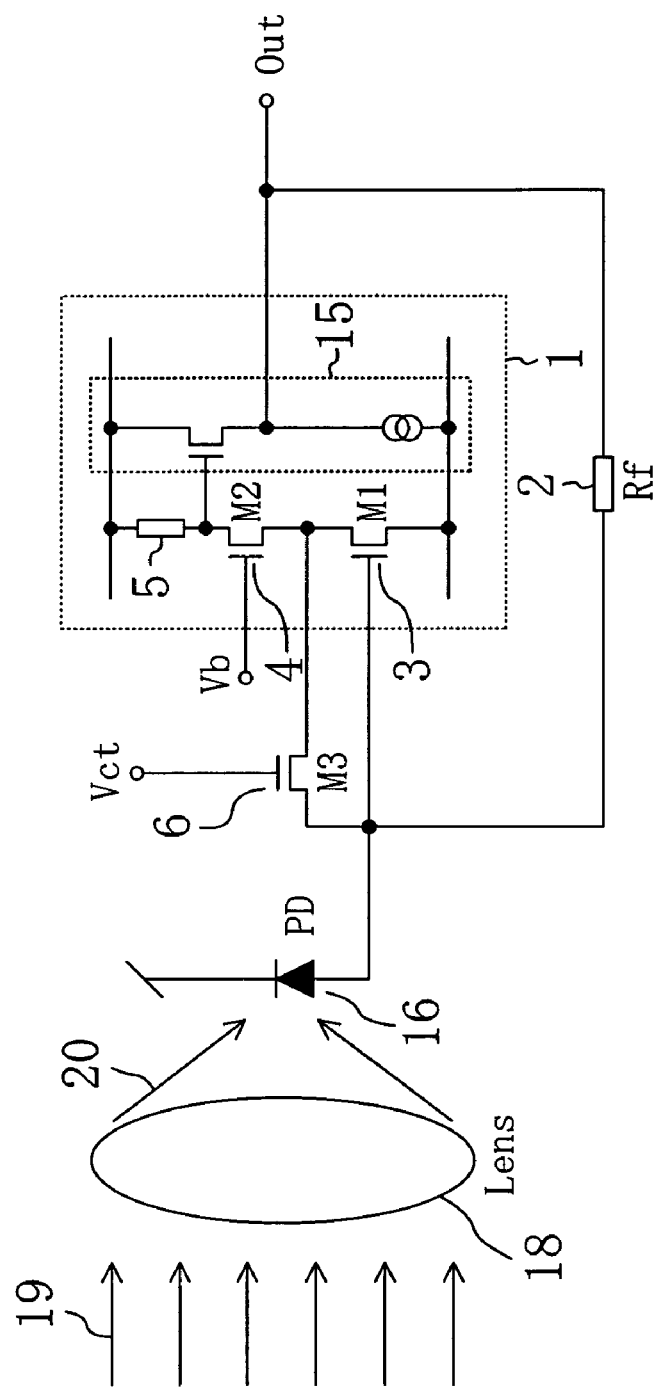
FIG. 14 is a block diagram of an optical receiver preamplifier according to a tenth embodiment of the present invention.

FIG. 14 illustrates a schematic configuration of the optical detector of the tenth embodiment. In FIG. 14, each member also shown in FIG. 1 of the first embodiment is identified by the same reference numeral, and therefore the description thereof will be omitted.

As shown in FIG. 14, the optical detector of this embodiment includes, in addition to the optical receiver preamplifier of the first embodiment, a photo diode 16 for converting an optical signal 20 obtained by condensing light 19 using a lens 18 to a current signal. Specifically, the photo diode 16 is connected to the input terminal of the optical receiver preamplifier of the first embodiment shown in FIG. 1, and the photo diode 16 and the lens 18 are coupled to each other.

According to the tenth embodiment, a current signal from the photo diode 16 is converted to a voltage signal and amplified by the optical receiver preamplifier of the first embodiment. Accordingly, even for an input signal of which a signal amplitude rapidly varies, saturation of an output voltage can be suppressed, so that an input dynamic range can be expanded. That is, an optical detector which allows a stable operation and has a wide input dynamic range characteristic can be realized.

In the tenth embodiment, the optical receiver preamplifier of the first embodiment is used. However, instead of the optical receiver preamplifier of the first embodiment, the optical receiver preamplifier of one of the second through eighth embodiments may be used.

INDUSTRIAL APPLICABILITY

The present invention relates to optical receiver preamplifiers and is useful particularly when being applied to an optical receiver circuit used in an optical communication system and the like.

The invention claimed is:

1. An optical receiver preamplifier, comprising:
    an inverting amplifier; and
    a current-voltage conversion element connected between input and output terminals of the inverting amplifier,
    wherein the inverting amplifier includes a first transistor having a gate connected to the input terminal of the inverting amplifier, a second transistor having a source connected to a drain of the first transistor and a gate to which a predetermined voltage is applied, and a load connected to a drain of the second transistor, and
    wherein the optical receiver preamplifier further includes a third transistor connected between the input terminal of the inverting amplifier and the source of the second transistor.

2. The optical receiver preamplifier of claim 1, wherein the predetermined voltage applied to the gate of the second transistor is controlled so that an input terminal voltage of the inverting amplifier and a source voltage of the second transistor agree with each other.

3. The optical receiver preamplifier of claim 2, further comprising an operational amplifier having an inverting input terminal connected to the source of the second transistor, a non-inverting input terminal connected to the input terminal of the inverting amplifier and an output terminal connected to the gate of the second transistor.

4. The optical receiver preamplifier of claim 2, further comprising:
   an operational amplifier having an inverting input terminal connected to the source of the second transistor and an output terminal connected to the gate of the second transistor; and
   a voltage generator circuit for outputting a voltage of the same level as that of the input terminal voltage of the inverting amplifier, the voltage generator circuit having an output terminal connected to the non-inverting input terminal of the operational amplifier.

5. The optical receiver preamplifier of claim 1, further comprising:
   a switch group including a plurality of switches, each being connected to the gate of the third transistor; and
   a plurality of voltage sources connected to the switches constituting the switch group, respectively,
   wherein a voltage selected from respective output voltages of the plurality of voltage sources by the switch group is applied to the gate of the third transistor.

6. The optical receiver preamplifier of claim 5, further comprising a comparator group including at least one comparator having one input terminal to which a voltage output from the inverting amplifier is applied and the other input terminal to which a predetermined voltage is applied,
   wherein, based on a comparison result of the comparator group, the switch group is controlled.

7. The optical receiver preamplifier of claim 5, further comprising:
   a fourth transistor having a source connected to the input terminal of the inverting amplifier and a gate connected to the output terminal of the inverting amplifier,
   another current-voltage conversion element connected to a drain of the fourth transistor; and
   a comparator group including at least one comparator having one input terminal to which a voltage applied to said another current-voltage conversion element is applied and the other input terminal to which a predetermined voltage is applied,
   wherein, based on a comparison result of the comparator group, the switch group is controlled.

8. The optical receiver preamplifier of claim 1, wherein the third transistor is provided plural in number,
   wherein the optical receiver preamplifier further includes a switch group having a plurality of switches, each being connected to a gate of each of the third transistors, and a plurality of voltage sources connected to the switches constituting the switch group, respectively, and
   wherein a voltage selected from respective output voltages of the plurality of voltage sources by the switch group is applied to a gate of each of the third transistors.

9. The optical receiver preamplifier of claim 8, further comprising a comparator group including at least one comparator having one input terminal to which a voltage output from the inverting amplifier is applied and the other input terminal to which a predetermined voltage is applied,
   wherein, based on a comparison result of the comparator group, the switch group is controlled.

10. The optical receiver preamplifier of claim 8, further comprising:
    a fourth transistor having a source connected to the input terminal of the inverting amplifier and a gate connected to an output terminal of the inverting amplifier;
    another current-voltage conversion element connected to a drain of the fourth transistor; and
    a comparator group including at least one comparator having one input terminal to which a voltage applied to said another current-voltage conversion element is applied and the other input terminal to which a predetermined voltage is applied,
    wherein, based on a comparison result of the comparator group, the switch group is controlled.

11. The optical receiver preamplifier of claim 1, further comprising an amplitude detector circuit for outputting a voltage according to an amplitude of a signal input to the input terminal, the amplitude detector circuit having an input terminal connected to the output terminal of the inverting amplifier,
    wherein a voltage output from the amplitude detector circuit is applied to a gate of the third transistor.

12. The optical receiver preamplifier of claim 1, wherein each of the first transistor and the second transistor is a bipolar transistor.

13. An optical communication receiver which includes the optical receiver preamplifier of claim 1, the optical communication receiver comprising a photo diode for converting an optical signal transmitted through an optical fiber to a current signal,
    wherein the current signal is converted to a voltage signal by the optical receiver preamplifier.

14. An optical detector which includes the optical receiver preamplifier of claim 1, the optical detector comprising a photo diode for converting a light signal obtained by condensing light to a current signal,
    wherein the current signal is converted to a voltage signal by the optical receiver preamplifier.

* * * * *